(12) United States Patent
Hu et al.

(10) Patent No.: US 12,183,863 B2
(45) Date of Patent: Dec. 31, 2024

(54) DRIVE BACKPLANE, MANUFACTURING METHOD THEREOF AND DISPLAY PANEL

(71) Applicants: Hefei Xinsheng Optoelectronics Technology Co., Ltd., Anhui (CN); BOE Technology Group Co., Ltd., Beijing (CN)

(72) Inventors: Haifeng Hu, Beijing (CN); Ting Zeng, Beijing (CN); Zhanqi Xu, Beijing (CN); Jian Yang, Beijing (CN); Liuyue Yin, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 615 days.

(21) Appl. No.: 17/407,948

(22) Filed: Aug. 20, 2021

(65) Prior Publication Data
US 2022/0140214 A1  May 5, 2022

(30) Foreign Application Priority Data
Oct. 30, 2020 (CN) .......................... 202011184775.0

(51) Int. Cl.
*H01L 33/62* (2010.01)
*H01L 25/075* (2006.01)
*H01L 27/15* (2006.01)
*H01L 33/00* (2010.01)
*H01L 33/52* (2010.01)

(52) U.S. Cl.
CPC .......... *H01L 33/62* (2013.01); *H01L 25/0753* (2013.01); *H01L 27/156* (2013.01); *H01L 33/005* (2013.01); *H01L 33/52* (2013.01); *H01L 2933/0066* (2013.01)

(58) Field of Classification Search
CPC .......... H01L 23/28–296; H01L 23/522–53295; H01L 23/538–5389; H01L 21/768–76898; H01L 21/288–2885; H01L 21/76871–76873; H01L 23/564; G03F 7/004–115
See application file for complete search history.

(56) References Cited

U.S. PATENT DOCUMENTS

| 5,149,615 | A | * | 9/1992 | Chakravorty | ..... H01L 21/76877 |
| | | | | | 257/E21.585 |
| 2006/0214305 | A1 | * | 9/2006 | Sakata | .............. H01L 21/02178 |
| | | | | | 257/E21.28 |
| 2020/0235128 | A1 | * | 7/2020 | Shin | .................. H01L 21/76894 |

\* cited by examiner

*Primary Examiner* — Robert G Bachner
*Assistant Examiner* — Eric Manuel Mulero Flores
(74) *Attorney, Agent, or Firm* — IPro, PLLC

(57) ABSTRACT

The present disclosure discloses a drive backplane, a manufacturing method thereof and a display panel. The drive backplane includes: a base substrate; a first conductive layer, located on the base substrate; a first flat layer, located in a region, other than a pattern of the first conductive layer, on the base substrate; a second flat layer, located on a side, facing away from the base substrate, of the first conductive layer and the first flat layer, where the second flat layer includes a plurality of first via holes; and a second conductive layer, located on a side, facing away from the base substrate, of the second flat layer, where a pattern of the second conductive layer is electrically connected with the pattern of the first conductive layer through the first via holes.

11 Claims, 9 Drawing Sheets

DRIVE BACKPLANE, MANUFACTURING METHOD THEREOF AND DISPLAY PANEL

The present application claims the priority from Chinese Patent Application No. 202011184775.0, filed with the Chinese Patent Office on Oct. 30, 2020, and entitled "DRIVE BACKPLANE, MANUFACTURING METHOD THEREOF AND DISPLAY PANEL", which is hereby incorporated by reference in its entirety.

FIELD

The present disclosure relates to the technical field of display, in particular to a drive backplane, a manufacturing method thereof and a display panel.

BACKGROUND

Miniature/Micro light-emitting diode (Mini LED and Micro LED) displays have the advantages of low power consumption, fast response, long life, high color saturation, high contrast, etc. With the continuous development of the display technology, miniature/micro light-emitting diode displays will become the next generation of displays after liquid crystal displays and organic electroluminescent displays.

SUMMARY

An embodiment of the present disclosure provides a drive backplane, including:
a base substrate;
a first conductive layer, located on the base substrate;
a first flat layer, located in a region, other than a pattern of the first conductive layer, on the base substrate;
a second flat layer, located on a side, facing away from the base substrate, of the first conductive layer and the first flat layer; where the second flat layer includes a plurality of first via holes; and
a second conductive layer, located on a side, facing away from the base substrate, of the second flat layer; where a pattern of the second conductive layer is electrically connected with the pattern of the first conductive layer through the first via holes.

In an embodiment, the drive backplane provided by the embodiment of the present disclosure further includes: a first inorganic layer located between the first conductive layer and the first flat layer; a third flat layer located on a side, facing away from the base substrate, of the second conductive layer; and a second inorganic layer located between the second conductive layer and the third flat layer; where
the first inorganic layer includes: a plurality of second via holes respectively corresponding to the plurality of first via holes;
the third flat layer includes: a plurality of third via holes; and
the second inorganic layer includes: a plurality of fourth via holes respectively corresponding to the plurality of third via holes.

In an embodiment, the drive backplane provided by the embodiment of the present disclosure further includes: a first anti-oxidation conductive layer located between the first conductive layer and the second conductive layer; and a second anti-oxidation conductive layer located on a side, facing away from the base substrate, of the second conductive layer; where a pattern of the first anti-oxidation conductive layer is consistent with the pattern of the first conductive layer; and
a pattern of the second anti-oxidation conductive layer is consistent with the pattern of the second conductive layer.

In an embodiment, in the drive backplane provided by the embodiment of the present disclosure, a thickness of the first flat layer is less than or equal to a thickness of the first conductive layer.

An embodiment of the present disclosure further provides a display panel, including: any of the above drive backplanes, and a plurality of light emitting diodes fixed on the drive backplane.

An embodiment of the present disclosure further provides a manufacturing method of any of the above drive backplanes, including:
forming the pattern of the first conductive layer on the base substrate;
forming a pattern of the first flat layer in the region other than the pattern of the first conductive layer;
forming the second flat layer on the first conductive layer and the first flat layer, and patterning the second flat layer to obtain a plurality of first via holes; and
forming the pattern of the second conductive layer on the second flat layer, where the pattern of the second conductive layer is electrically connected with the pattern of the first conductive layer through the first via holes.

In an embodiment, in the manufacturing method provided by the embodiment of the present disclosure, the forming the pattern of the first conductive layer on the base substrate includes:
forming an electroplating seed layer on the base substrate;
forming a photoresist layer on the electroplating seed layer, and patterning the photoresist layer to obtain a pattern of the photoresist layer complementary to the pattern of the first conductive layer to be formed; and
forming the pattern of the first conductive layer by adopting an electroplating process with the pattern of the photoresist layer as a shield;
where the forming the pattern of the first flat layer in the region other than the pattern of the first conductive layer includes:
forming the first flat layer on the first conductive layer by adopting a photoresist material with the same photo-sensitivity as the photoresist layer; and
patterning the first flat layer by adopting the same mask as patterning the photoresist layer.

In an embodiment, in the manufacturing method provided by the embodiment of the present disclosure, the forming the pattern of the first conductive layer on the base substrate includes:
forming an electroplating seed layer on the base substrate;
forming a photoresist layer on the electroplating seed layer, and patterning the photoresist layer to obtain a pattern of the photoresist layer consistent with the pattern of the first conductive layer to be formed;
patterning the electroplating seed layer to obtain a pattern of the electroplating seed layer; and
forming the first conductive layer on the base substrate by adopting an electroplating process;
where the forming the pattern of the first flat layer in the region other than the pattern of the first conductive layer includes:

forming the first flat layer on the first conductive layer by adopting a photoresist material opposite to a photosensitivity of the photoresist layer; and patterning the first flat layer with the same mask as patterning the photoresist layer.

In an embodiment, in the manufacturing method provided by the embodiment of the present disclosure, after forming the pattern of the first conductive layer on the base substrate, and before forming the pattern of the first flat layer in the region other than the pattern of the first conductive layer, the method further includes:

forming a first inorganic layer on the first conductive layer;

where after patterning the second flat layer and before forming the pattern of the second conductive layer on the second flat layer, the method further includes:

patterning the first inorganic layer with a pattern of the second flat layer as a shield to obtain a plurality of second via holes respectively corresponding to the plurality of first via holes.

In an embodiment, in the manufacturing method provided by the embodiment of the present disclosure, after forming the pattern of the second conductive layer on the second flat layer, the method further includes:

forming a second inorganic layer on the second conductive layer;

forming a third flat layer on the second inorganic layer, and patterning the third flat layer to obtain a plurality of third via holes; and patterning the second inorganic layer with the third flat layer as a shield to obtain a plurality of fourth via holes respectively corresponding to the plurality of third via holes.

In an embodiment, in the manufacturing method provided by the embodiment of the present disclosure, after forming the pattern of the first conductive layer on the base substrate, and before forming the pattern of the first flat layer in the region other than the pattern of the first conductive layer, the method further includes:

forming a pattern of a first anti-oxidation conductive layer on the first conductive layer, where the pattern of the first anti-oxidation conductive layer is consistent with the pattern of the first conductive layer;

where after forming the pattern of the second conductive layer on the second flat layer, the method further includes:

forming a pattern of a second anti-oxidation conductive layer on the second conductive layer, where the pattern of the second anti-oxidation conductive layer is consistent with the pattern of the second conductive layer.

In an embodiment, in the manufacturing method provided by the embodiment of the present disclosure, the forming the electroplating seed layer on the base substrate includes:

forming the electroplating seed layer on the base substrate, and patterning the electroplating seed layer, where the patterned electroplating seed layer includes: a plurality of first alignment marks and a plurality of second alignment marks;

where the patterning the photoresist layer includes:

providing a mask, where the mask includes: a plurality of third alignment marks respectively corresponding to the plurality of first alignment marks, and a plurality of fourth alignment marks respectively corresponding to the plurality of second alignment marks;

shielding the photoresist layer by adopting the mask; and exposing the photoresist layer; where in the exposing process of the photoresist layer, the plurality of fourth alignment marks in the mask is shielded by adopting a baffle, and the third alignment marks in the mask are aligned with the first alignment marks in the electroplating seed layer; and where the patterning the first flat layer by adopting the same mask as patterning the photoresist layer includes:

shielding the first flat layer by adopting the mask, and exposing the first flat layer; where in the exposing process of the first flat layer, the baffle is moved to expose the fourth alignment marks in the mask, and the fourth alignment marks in the mask are aligned with the second alignment marks in the electroplating seed layer.

DETAILED DESCRIPTION OF THE EMBODIMENTS

Figure 1:
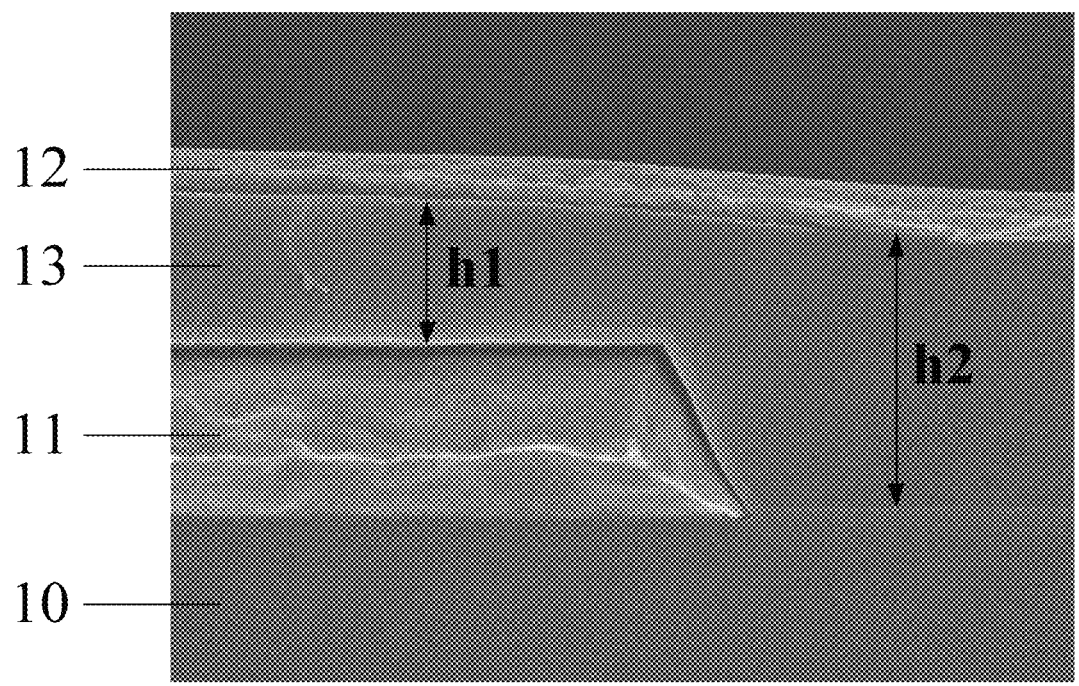
FIG. 1 is a scanning electron microscope diagram of a drive backplane in the related art.

In the related art, in order to improve the performance of miniature/micro light-emitting diode displays, the drive resistance of drive backplane needs to be decreased. FIG. 1 is a scanning electron microscope diagram of a drive backplane in the related art. As shown in FIG. 1, the drive backplane includes a base substrate 10, a first conductive layer 11, a second conductive layer 12, and a flat layer 13, where the second conductive layer 12 is overlapped with the first conductive layer 11 through via holes (not shown in the figure) in the flat layer 13. In order to decrease the drive resistance of the drive backplane, the thickness of the first conductive layer 11 needs to be increased, for example, in order to decrease the sheet resistance of the first conductive layer 11 to less than $0.002\Omega/\square$, the thickness of the first conductive layer 11 needs to be set to be greater than 7 μm. In order to ensure that the first conductive layer 11 may be covered and that the first conductive layer 11 and the second conductive layer 12 are insulated from each other except for the positions of the via holes, the thickness of the flat layer 13 needs to be increased.

Continuing to refer to FIG. 1, since a segment gap of a pattern of the first conductive layer 11 is large, and a material of the flat layer 13 has a self-leveling property, a difference between a thickness h1 of the flat layer 13 located on the pattern of the first conductive layer 11 and a thickness h2 of the flat layer 13 located in a region, other than the pattern of the first conductive layer 11 is large (about 2 mm), resulting in poor thickness uniformity of the flat layer 13. In addition, since the thickness uniformity of the flat layer 13 is poor, a difference between sizes of the via holes formed at the position where the thickness of the flat layer 13 is larger and a design value is large under the same exposure duration in the manufacturing process; via holes cannot even penetrate through the flat layer 13; and the overlapping effect of the first conductive layer 11 and the second conductive layer 12 is influenced. In addition, in the related art, in order to form via holes satisfying design requirements in the flat layer 13, the flat layer 13 is subjected to two patterning processes, one is used to form via holes with a larger size at the position where the thickness of the flat layer 13 is large, and the other is used to form via holes with a smaller size at the position where the thickness of the flat layer 13 is small, which increases the process steps and manufacturing costs.

Therefore, an embodiment of the present disclosure provides a drive backplane, a manufacturing method thereof and a display panel.

The specific implementations of the drive backplane, the manufacturing method thereof, and the display panel provided by the embodiments of the present disclosure will be described in detail below with reference to the accompanying drawings. The thickness and shape of each film layer in the drawings are not to scale and are intended to be merely illustrative of the present disclosure.

Figure 2:
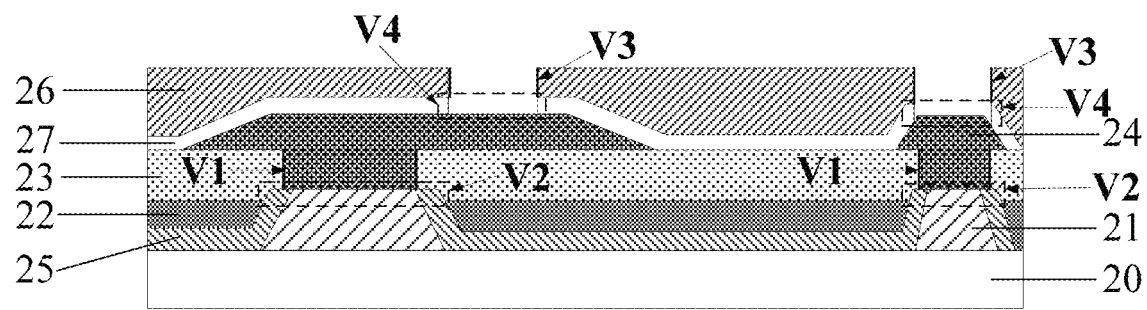
FIG. 2 is a schematic structural diagram of a drive backplane according to an embodiment of the present disclosure.

FIG. 2 is a schematic structural diagram of a drive backplane provided by an embodiment of the present disclosure. As shown in FIG. 2, the drive backplane provided by the embodiment of the present disclosure may include:
a base substrate 20;
a first conductive layer 21, located on the base substrate 20;
a first flat layer 22, located in a region, other than a pattern of the first conductive layer 21, on the base substrate 20;
a second flat layer 23, located on a side, facing away from the base substrate 20, of the first conductive layer 21 and the first flat layer 22; where the second flat layer 23 includes a plurality of first via holes V1; and
a second conductive layer 24, located on a side, facing away from the base substrate 20, of the second flat layer 23; where a pattern of the second conductive layer 24 is electrically connected with the pattern of the first conductive layer 21 through the first via holes V1.

In the drive backplane provided by the embodiment of the present disclosure, by disposing the first flat layer in the region, other than the pattern of the first conductive layer, on the base substrate, in the manufacturing process, the first flat layer with the good thickness uniformity may be formed. Moreover, a segment gap between the first conductive layer and the first flat layer is small, so that the thickness uniformity of the formed second flat layer may be good. Therefore, the flat layers (namely, the first flat layer and the second flat layer) between the first conductive layer and the second conductive layer have the good thickness uniformities. Due to the good thickness uniformity of the second flat layer, the difference between the actual size of the first via holes in the second flat layer and the design value may be small, and the overlapping effect between the first conductive layer and the second conductive layer is ensured. In addition, since the pattern of the first flat layer is complementary to the pattern of the first conductive layer, in the manufacturing process, the first flat layer may be patterned by adopting the same mask as patterning the first conductive layer. Compared with the related art, which adopts the patterning process twice to pattern the flat layer, the embodiment of the present disclosure may save a mask and save the manufacturing cost.

Optionally, in the drive backplane provided by the embodiment of the present disclosure, as shown in FIG. 2, the thickness of the first flat layer 22 is less than or equal to the thickness of the first conductive layer 21. In this way, it may be avoided that the thickness of the first flat layer 22 is too large, resulting in poor thickness uniformity of the first flat layer 22 formed in the manufacturing process. In specific implementation, the thickness of the first flat layer 22 may be set to be greater than half of the thickness of the first conductive layer 21, for example, when the thickness of the first conductive layer 21 is about 7 μm, the thickness of the first flat layer 22 may be set to be about 5 μm. In this way, it may be avoided that the thickness of the first flat layer 22 is too small, resulting in poor thickness uniformity of the second flat layer 23 formed in the manufacturing process.

Figure 3:
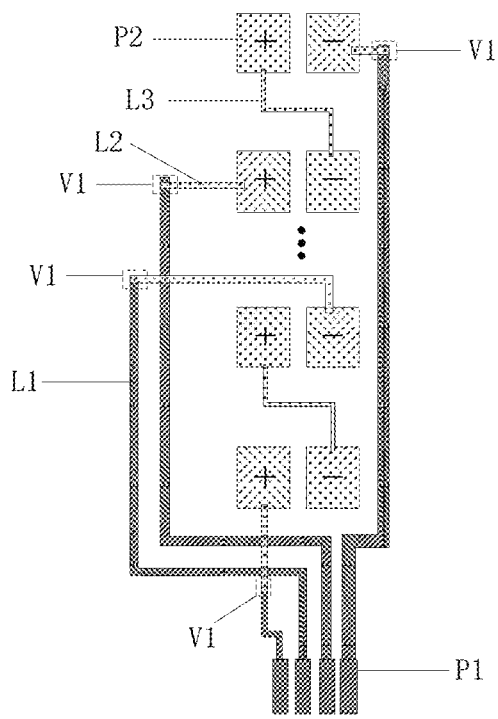
FIG. 3 is a schematic planar structural diagram of a drive backplane according to an embodiment of the present disclosure.

FIG. 3 is a schematic planar structural diagram of the drive backplane in the embodiment of the present disclosure. As shown in FIG. 3, the first conductive layer may include: a plurality of binding electrodes P1, and a plurality of first connecting lines L1; and the second conductive layer may include: a plurality of connecting electrodes P2, and a plurality of second connecting lines L2. The binding electrodes P1 are used for being electrically connected with a drive chip; for example, the binding electrodes P1 may be directly electrically connected with the drive chip, or, the drive chip may also be fixed on a flexible circuit board, and the binding electrodes P1 are electrically connected with the drive chip through the flexible circuit board. The connecting electrodes P2 are used for being electrically connected with light emitting diodes, and the connecting electrodes P2 include first connecting electrodes and second connecting electrodes. The first connecting electrodes (namely the connecting electrodes P2 marked with "+" as shown in the figure) are used for being electrically connected with positive electrodes of the light emitting diodes, and the second connecting electrodes (namely the connecting electrodes P2 marked with "−" as shown in the figure) are used for being electrically connected with negative electrodes of the light emitting diodes. One end of each of the first connecting lines L1 is electrically connected with a binding electrode P1, the other end of each of the first connecting lines L1 is electrically connected with a second connecting line L2 through the first via hole V1, and the second connecting line L2 is electrically connected with the connecting electrode P2, so that electrical connection between the binding electrodes P1 and the connecting electrodes P2 is realized, and the light emitting diodes may be controlled to emit light through the drive chip. In addition, the second conductive layer may further include: a plurality of third connecting lines L3 for connecting the first connecting electrodes with the second connecting electrodes, so as to realize the series connection of the light emitting diodes.

It should be noted that the structure of the first conductive layer and the second conductive layer is exemplified by the structure shown in FIG. 3 in the embodiment of the present disclosure, and the first conductive layer and the second conductive layer may also include other structures in a specific embodiment, which is not limited here. In addition, in order to illustrate the connection relationship between the first conductive layer and the second conductive layer in FIG. 3, the pattern of the first conductive layer and the pattern of the second conductive layer are shown in the same plan view; and actually, the first conductive layer and the second conductive layer are stacked, and are electrically connected through the first via holes in the second flat layer.

In specific implementation, in order to improve the performance of the drive backplane and decrease the drive resistance of the drive backplane, the thickness of the first conductive layer may be set to be greater than 7 μm to decrease the sheet resistance of the first conductive layer. In addition, the first conductive layer may be made of a material with good conductivity, for example, the first conductive layer may be made of a metal material (such as metallic copper), or other materials with good conductivity, which is not limited here. Since the length of the connecting lines in the second conductive layer is short, the thickness of the second conductive layer may be set to be smaller than the thickness of the first conductive layer, for example, the thickness of the second conductive layer may be set to be about several thousand angstroms. The second conductive layer may also be made of a metal material with good conductivity (such as metallic copper), or other materials with good conductivity, which is not limited here.

Optionally, the first flat layer and the second flat layer may be made of photosensitive resin materials, for example, polyimide resin, silane, etc. In the manufacturing process, the pattern of the flat layer and the pattern of the second flat layer may be formed by the exposure and development process, and the manufacturing process is simple. In addition, the first flat layer and the second flat layer may also be made of other insulating materials, which is not limited here. Furthermore, the first flat layer and the second flat layer may be made of the same material, or different materials, which is not limited here.

In specific implementation, the materials for manufacturing the first flat layer are generally a mixture, including solvents, reactive monomers, additives, etc. Due to the different proportions of the mixture, the baking temperatures in the curing process of the first flat layer are different. Therefore, the materials for manufacturing the first flat layer include a high-temperature curing material and a low-temperature curing material. When the high-temperature curing material is adopted to manufacture the first flat layer, the baking temperature in the curing process is about 230°. In the manufacturing process of the first flat layer, the first conductive layer is prone to being oxidized at a high temperature, resulting in bubbling and other defects of the film layer.

Therefore, the drive backplane provided by the embodiment of the present disclosure, as shown in FIG. 2, may further include: a first inorganic layer 25 located between the first conductive layer 21 and the first flat layer 22; a third flat layer 26 located on the side, facing away from the base substrate 20, of the second conductive layer 24; and a second inorganic layer 27 located between the second conductive layer 24 and the third flat layer 26;
    the first inorganic layer 25 includes: a plurality of second via holes V2 respectively corresponding to all the first via holes V1;
    the third flat layer 26 includes: a plurality of third via holes V3; and
    the second inorganic layer 27 includes: a plurality of fourth via holes V4 respectively corresponding to all the third via holes V3.

The first inorganic layer 25 is disposed between the first conductive layer 21 and the first flat layer 22, and the first inorganic layer 25 has the function of blocking water vapor and oxygen, thereby improving the airtightness of the drive backplane and preventing water vapor and oxygen from corroding the drive backplane. If the high-temperature curing material is adopted to manufacture the first flat layer 22, the first inorganic layer 25 may prevent the first conductive layer 21 from being oxidized at the high temperature in the manufacturing process of the first flat layer 22.

In the same way, the second inorganic layer 27 is disposed between the second conductive layer 24 and the third flat layer 26, and the second inorganic layer 27 also has the function of blocking water vapor and oxygen, thereby further improving the airtightness of the drive backplane. If the third flat layer 26 is made of the high-temperature curing material, the second inorganic layer 27 may prevent the second conductive layer 24 from being oxidized at the high temperature in the manufacturing process of the third flat layer 26. Specifically, the first inorganic layer 25 and the second inorganic layer 27 may be made of the inorganic material such as SiN or SiNO, or other inorganic materials, which is not limited here.

Continuing to refer to FIG. 2, by disposing the third flat layer 26 on the side, facing away from the base substrate 20, of the second conductive layer 24, the drive backplane may be protected and flattened. The second via holes V2 corresponding to the first via holes V1 are disposed in the first inorganic layer 25, so that the first conductive layer 21 may be electrically connected with the second conductive layer 24 through the first via holes V1 and the second via holes V2. Meanwhile, referring to FIG. 3, the third via holes V3 and the fourth via holes V4 may be disposed at the positions of the binding electrodes P1, so that the binding electrodes P1 are exposed, which facilitates the subsequent electrical connection between the binding electrodes P1 and the drive chip.

In addition, if the first flat layer and the third flat layer are made of the low-temperature curing material and the baking temperature in the curing process is about 130°, the first conductive layer and the second conductive layer are not prone to being oxidized, so that the first inorganic layer and the second inorganic layer may be omitted. Of course, in order to prevent the first conductive layer and the second conductive layer from being oxidized, and to improve the airtightness of the drive backplane, when the first flat layer and the third flat layer are made of the low-temperature curing material, the first inorganic layer and the second inorganic layer may also be set, which is not limited here.

In practical applications, the greater the thickness of the first conductive layer, the greater the thickness of the first inorganic layer is required to ensure that the first inorganic layer may completely cover the steep slope at the edge of the pattern of the first conductive layer; for example, if the thickness of the first conductive layer is about 7 μm, the thickness of the first inorganic layer needs to be set to about 5000 angstroms. However, in the manufacturing process, the pattern of the second flat layer is used as a shield to etch the first inorganic layer, and the etching speed of the second flat layer is greater than the etching speed of the first inorganic layer, so that the thickness of the first inorganic layer may not be too large. Otherwise, the pattern of the second flat layer will be damaged in the etching process. Therefore, if the thickness of the first conductive layer is large, in order to avoid the pattern of the second flat layer from being damaged, the first flat layer may be made of the low-temperature curing material, and the first inorganic layer is omitted.

Figure 4:
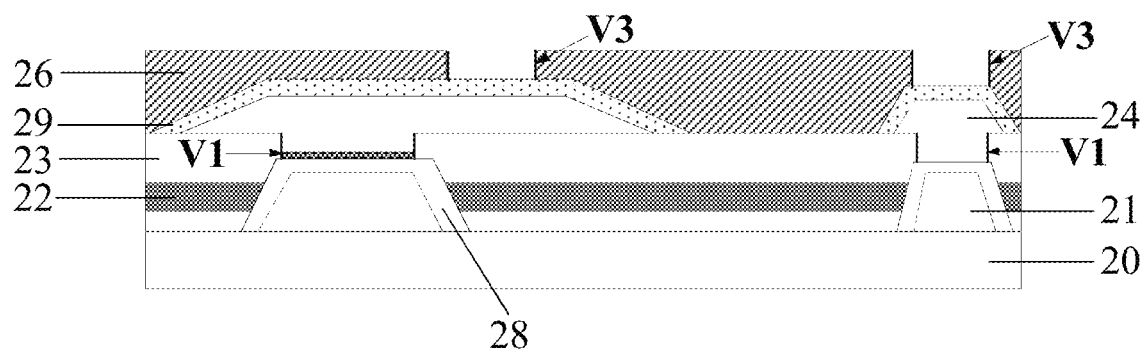
FIG. 4 is another schematic structural diagram of a drive backplane according to an embodiment of the present disclosure.

FIG. 4 is another schematic structural diagram of the drive backplane provided by the embodiment of the present disclosure. As shown in FIG. 4, the drive backplane provided by the embodiment of the present disclosure may further include: a first anti-oxidation conductive layer 28 located between the first conductive layer 21 and the second conductive layer 24; and a second anti-oxidation conductive layer 29 located on the side, facing away from the base substrate 20, of the second conductive layer 24;

a pattern of the first anti-oxidation conductive layer 28 is consistent with the pattern of the first conductive layer 21; and a pattern of the second anti-oxidation conductive layer 29 is consistent with the pattern of the second conductive layer 24.

Since the first anti-oxidation conductive layer 28 is disposed between the first conductive layer 21 and the second conductive layer 24, and the pattern of the first anti-oxidation conductive layer 28 is consistent with the pattern of the first conductive layer 21, the first conductive layer 21 may be protected against oxidation. In order to further improve the protective effect of the first anti-oxidation conductive layer 28, the pattern of the first anti-oxidation conductive layer 28 may be set to cover the pattern of the first conductive layer 21. In the same way, since the second anti-oxidation conductive layer 29 is disposed on the side, facing away from the base substrate 20, of the second conductive layer 24, and the pattern of the second anti-oxidation conductive layer 29 is consistent with the pattern of the second conductive layer 24, the second conductive layer 24 may be protected against oxidation. In order to further improve the protective effect of the second anti-oxidation conductive layer 29, the pattern of the second anti-oxidation conductive layer 29 may be set to cover the pattern of the second conductive layer 24. Specifically, the first anti-oxidation conductive layer 28 and the second anti-oxidation conductive layer 29 may be made of a metal material that is not prone to being oxidized (such as gold), or a metal alloy (such as CuNi), or other materials, which is not limited here.

Based on the same inventive concept, an embodiment of the present disclosure also provides a display panel, which may include any of the above drive backplanes, and a plurality of light emitting diodes fixed on the drive backplane. Since the principle of the display panel to solve the problems is similar to that of the above drive backplane, the implementation of the display panel may refer to the implementation of the above drive backplane, which will not be repeated here. The above light emitting diodes may be Mini LEDs and Micro LEDs, and are controlled to emit light by the drive backplane to realize picture display.

Based on the same inventive concept, an embodiment of the present disclosure also provides a manufacturing method of any of the above drive backplanes. Since the principle of the manufacturing method to solve the problems is similar to that of the drive backplane, the implementation of the manufacturing method may refer to the implementation of the drive backplane, which will not be repeated here.

Figure 5:
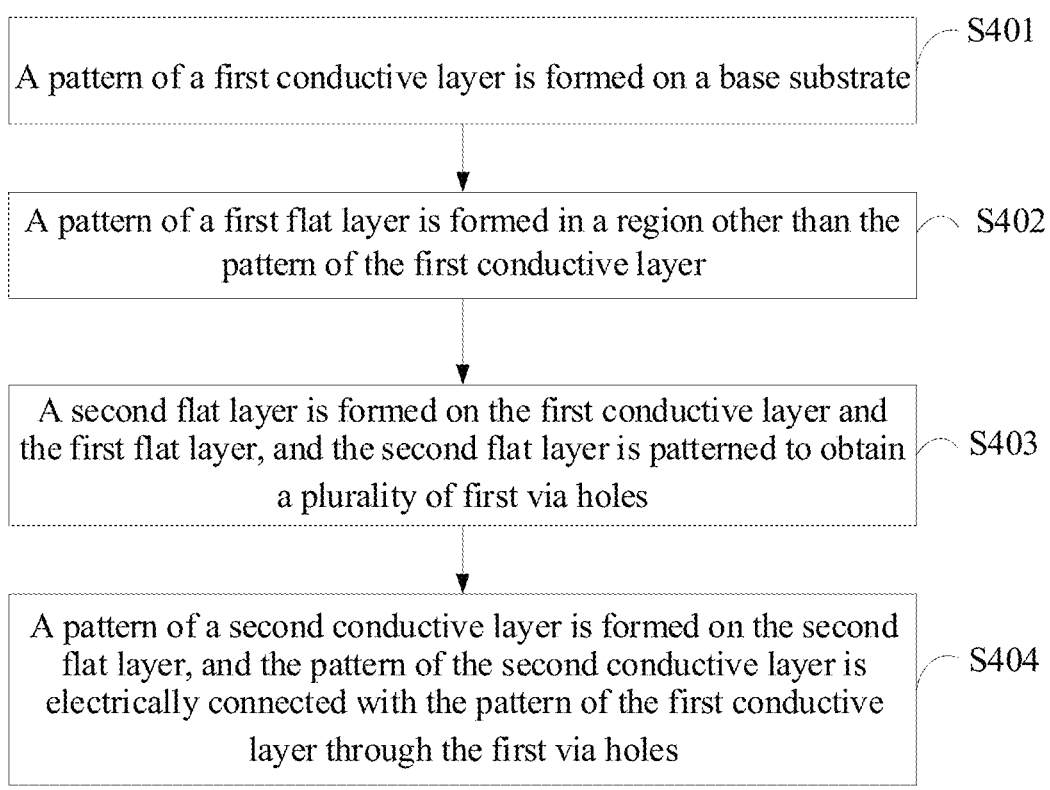
FIG. 5 is a flowchart of a manufacturing method of any of drive backplanes according to an embodiment of the present disclosure.

The manufacturing method of any of the drive backplanes provided by the embodiment of the present disclosure, as shown in FIG. 5, may include the following.

Figure 6A:
FIG. 6A to FIG. 6L are schematic structural diagrams corresponding to some steps in a manufacturing method according to an embodiment of the present disclosure.
Figure 6B:
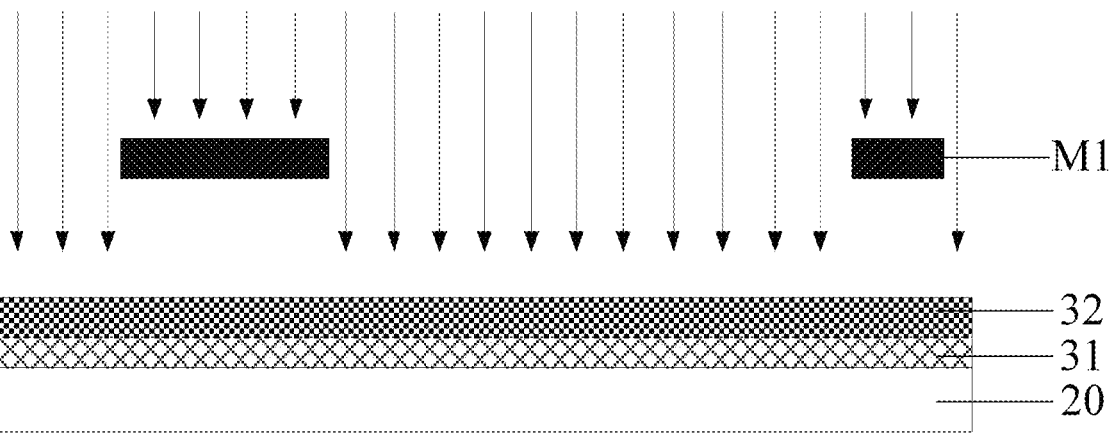
Figure 6C:
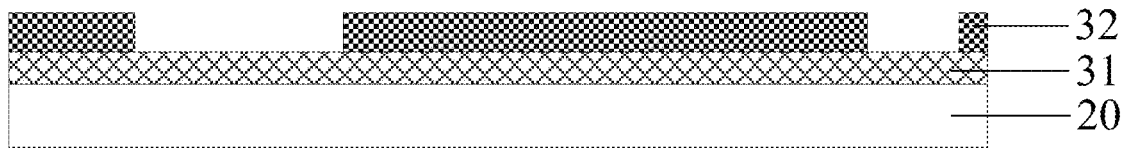
Figure 6D:

S401, referring to FIG. 6D, a pattern of a first conductive layer 21 is formed on a base substrate 20.

Figure 6E:
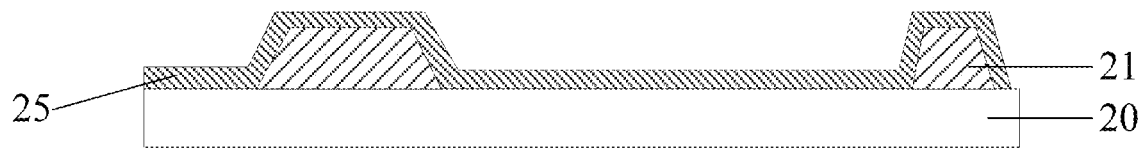
Figure 6F:
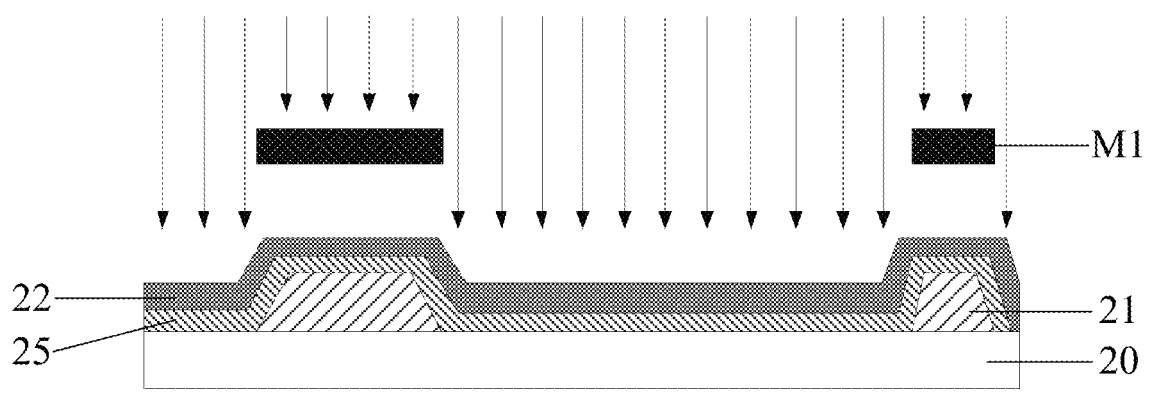
Figure 6G:
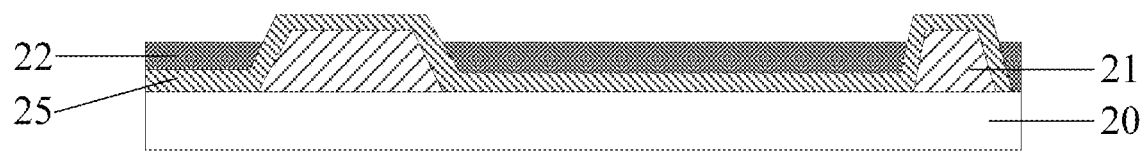

S402, referring to FIG. 6G, a pattern of a first flat layer 22 is formed in a region other than the pattern of the first conductive layer 21.

Figure 6H:
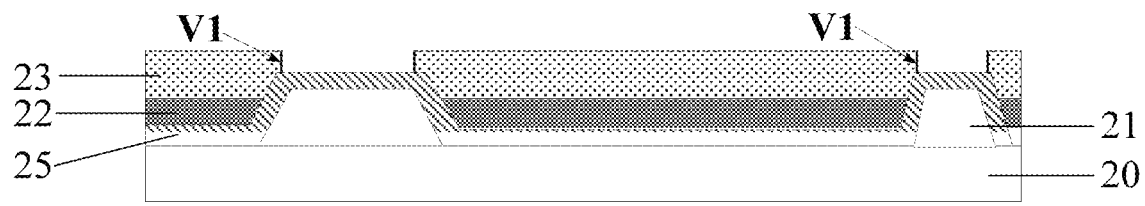

S403, referring to FIG. 6H, a second flat layer 23 is formed on the first conductive layer 21 and the first flat layer 22, and the second flat layer 23 is patterned to obtain a plurality of first via holes V1.

Figure 6I:
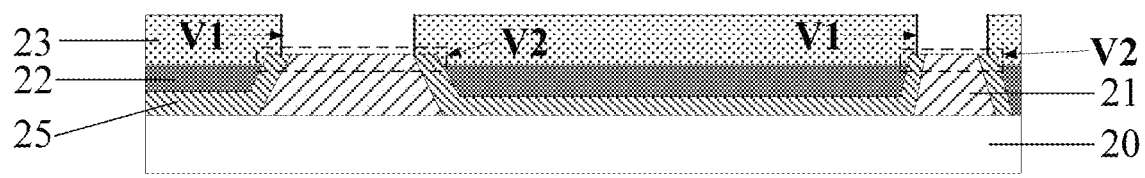
Figure 6J:
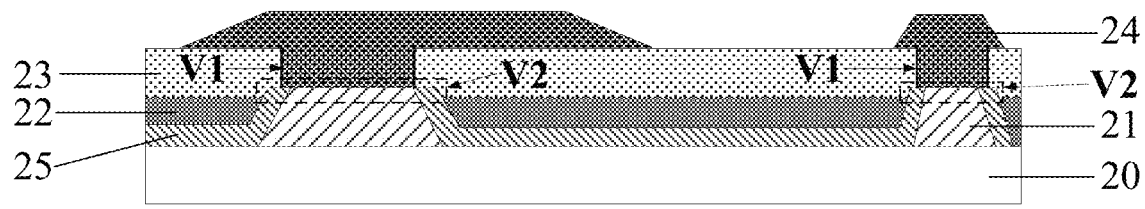

S404, referring to FIG. 6J, a pattern of a second conductive layer 24 is formed on the second flat layer 23, and the pattern of the second conductive layer 24 is electrically connected with the pattern of the first conductive layer 21 through the first via holes V1.

In the manufacturing method provided by the embodiment of the present disclosure, by forming the pattern of the first flat layer in the region other than the pattern of the first conductive layer, the formed first flat layer has good thickness uniformity. Moreover, a segment gap between the first conductive layer and the first flat layer is small, so that the formed second flat layer has good thickness uniformity. Therefore, the flat layers (namely, the first flat layer and the second flat layer) between the first conductive layer and the second conductive layer have the good thickness uniformities. Due to the good thickness uniformity of the second flat layer, the difference between the actual size of the formed first via holes and the design value is small, and the overlapping effect between the first conductive layer and the second conductive layer is ensured. In addition, since the pattern of the first flat layer is complementary to the pattern of the first conductive layer, the first flat layer may be patterned by adopting the same mask as patterning the first conductive layer. Compared with the related art, which adopts the patterning process twice to pattern the flat layer, one mask may be omitted, and the manufacturing cost may be saved.

In the embodiment of the present disclosure, at least the following two methods may be used to form the pattern of the first conductive layer and the pattern of the first flat layer, which will be described in detail below with reference to the accompanying drawings.

Method 1.

Step S401 may include the following.

As shown in FIG. 6A, an electroplating seed layer 31 is formed on the base substrate 20. The electroplating seed layer 31 is thin, and may be used as an electrode in the electroplating process, for example, the thickness of the electroplating seed layer 31 may be about 3000 angstroms. The electroplating seed layer 31 may be made of the same material as the first conductive layer 21, for example, metal copper.

As shown in FIG. 6B, a photoresist layer 32 is formed on the electroplating seed layer 31, and the photoresist layer 32 is patterned to obtain a pattern of the photoresist layer 32 complementary to the pattern of the first conductive layer to be formed, as shown in FIG. 6C. Specifically, the photoresist layer 32 may be shielded by adopting a mask M1, and then the photoresist layer 32 is exposed; arrows in FIG. 6B indicate rays of light in the exposure process; and after the development process, the pattern of the photoresist layer 32 as shown in FIG. 6C is obtained. It should be noted that in Method 1, the photoresist layer 32 is illustrated as a negative photoresist. In specific implementation, the photoresist layer 32 may also be a positive photoresist, which is not limited here.

Referring to FIG. 6C, the pattern of the photoresist layer 32 is used as a shield, and the pattern of the first conductive layer 21 as shown in FIG. 6D is formed by an electroplating process. Specifically, the drive backplane shown in FIG. 6C may be placed in an electroplating solution, the pattern of the first conductive layer 21 is formed in a region not shielded by the photoresist layer 32, then the photoresist layer 32 is stripped, and an excess electroplating seed layer (that is, part of the electroplating seed layer shielded by the photoresist layer in the electroplating process) is removed by an etching process, thereby obtaining the structure as shown in FIG. 6D.

Step S402 may include the following.

As shown in FIG. 6F, the first flat layer 22 is formed on the first conductive layer 21 by adopting a photoresist material with the same sensitivity as the photoresist layer.

Also referring to FIG. 6F, the first flat layer 22 is patterned by adopting the same mask as patterning the photoresist layer, that is, the mask M1 may be used to shield the first flat layer 22, and then the first flat layer 22 is exposed; arrows in FIG. 6F represent rays of light in the exposure process; and after the development process, the pattern of the first flat layer 22 as shown in FIG. 6G is obtained. It should be noted that in Method 1, the first flat layer 22 is illustrated as a negative photoresist. In specific implementation, the first flat layer 22 may also be a positive photoresist, as long as having the same sensitivity as the photoresist layer, which is not limited here.

Method 2.

Step S401 may include the following.

As shown in FIG. 6A, an electroplating seed layer 31 is formed on the base substrate 20. The electroplating seed layer 31 is thin, and may be used as an electrode in the electroplating process, for example, the thickness of the electroplating seed layer 31 may be about 3000 angstroms. The electroplating seed layer 31 may be made of the same material as the first conductive layer 21, for example, metal copper.

Figure 7A:
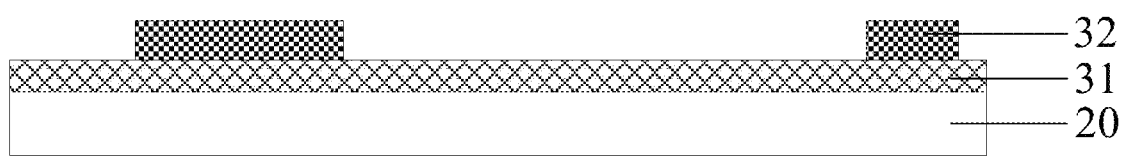
FIG. 7A and FIG. 7B are schematic structural diagrams corresponding to some steps in a manufacturing method according to an embodiment of the present disclosure.

As shown in FIG. 6B, a photoresist layer 32 is formed on the electroplating seed layer 31, and the photoresist layer 32 is patterned to obtain a pattern of the photoresist layer 32 consistent with the pattern of the first conductive layer to be formed, as shown in FIG. 7A. Specifically, the photoresist layer 32 may be shielded by adopting a mask M1, and then the photoresist layer 32 is exposed; arrows in FIG. 6B represent rays of light in the exposure process; and after the development process, the pattern of the photoresist layer 32 as shown in FIG. 7A is acquired. It should be noted that in Method 2, the photoresist layer 32 is illustrated as a positive photoresist. In specific implementation, the photoresist layer 32 may also be a negative photoresist, which is not limited here.

Figure 7B:

The electroplating seed layer 31 is patterned to obtain a pattern of the electroplating seed layer 31 as shown in FIG. 7B.

The first conductive layer 21 is formed on the base substrate 20 by an electroplating process to obtain the structure as shown in FIG. 6D. In Method 2, since the electroplating seed layer 31 is patterned first, the pattern of the electroplating seed layer 31 is consistent with the pattern of the first conductive layer 21 to be formed. In the electroplating process, the drive backplane as shown in FIG. 7B is placed in an electroplating solution, and the pattern of the first conductive layer 21 is formed at the position of the pattern of the electroplating seed layer 31, thereby obtaining the structure as shown in FIG. 6D.

Step S402 may include the following.

As shown in FIG. 6F, the first flat layer 22 is formed on the first conductive layer 21 by adopting a photoresist material opposite to the photosensitivity of the photoresist layer.

Also referring to FIG. 6F, the first flat layer 22 is patterned by adopting the same mask as patterning the photoresist layer, that is, the mask M1 may be used to shield the first flat layer 22, and then the first flat layer 22 is exposed; arrows in FIG. 6F indicate rays of light in the exposure process; and after the development process, the pattern of the first flat layer 22 as shown in FIG. 6G is obtained. It should be noted that in Method 2, the first flat layer 22 is illustrated as a negative photoresist. In specific implementation, the first flat layer 22 may also be a positive photoresist, as long as having opposite sensitivity to the photoresist layer, which is not limited here.

It should be noted that in the embodiment of the present disclosure, step S401 is performed first, and then step S402 is performed, that is, the pattern of the first conductive layer is formed first, and then the pattern of the first flat layer is formed. In specific implementation, step S402 may be performed first, and then step S401 may be performed, that is, the pattern of the first flat layer may be formed first, and then the pattern of the first conductive layer may be formed, which is not limited here.

Optionally, after step S401 and before step S402, the manufacturing method provided by the embodiment of the present disclosure may further include the following:

as shown in FIG. 6E, a first inorganic layer 25 is formed on the first conductive layer 21.

After step S403 and before step S404, the manufacturing method may further include the following:

referring to FIGS. 6H and 6I, the first inorganic layer 25 is patterned by using the pattern of the second flat layer 23 as a shield to obtain a plurality of second via holes V2 respectively corresponding to all the first via holes V1.

By forming the first inorganic layer 25 on the first conductive layer 21, the drive backplane may be prevented from being corroded by water vapor and oxygen, and the first conductive layer 21 may be prevented from being oxidized. Since a pattern of the first inorganic layer 25 is consistent with the pattern of the second flat layer 23, in the patterning process of the first inorganic layer 25, the first inorganic layer 25 may be shielded with the pattern of the second flat layer 23 instead of forming a photoresist layer thereon, which saves manufacturing cost.

In specific implementation, after step S404, the manufacturing method provided by the embodiment of the present disclosure may further include the following.

Figure 6K:
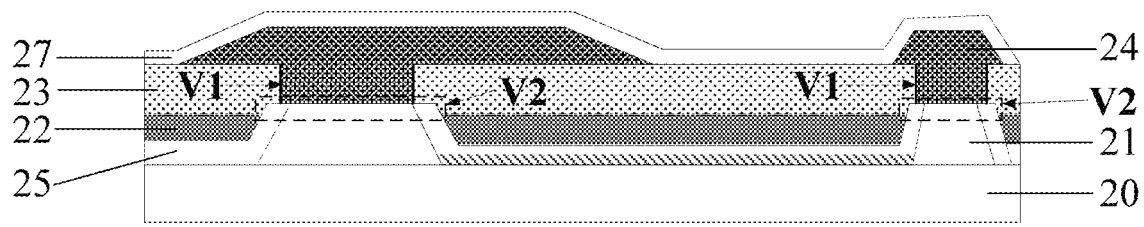

As shown in FIG. 6K, a second inorganic layer 27 is formed on the second conductive layer 24.

Figure 6L:
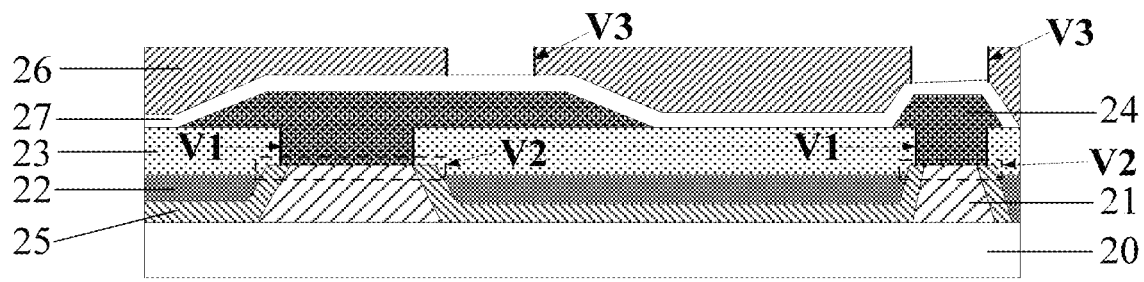

As shown in FIG. 6L, a third flat layer 26 is formed on the second inorganic layer 27, and the third flat layer 26 is patterned to obtain a plurality of third via holes V3.

The second inorganic layer 27 is patterned with the third flat layer 26 as a shield to obtain a plurality of fourth via holes V4 respectively corresponding to all the third via holes V3.

By forming the second inorganic layer 27 on the second conductive layer 24, the drive backplane may be prevented from being corroded by water vapor and oxygen, and the second conductive layer 24 may be prevented from being oxidized. By forming the third flat layer 26 on the second inorganic layer 27, the drive backplane may be protected and flattened. Since a pattern of the second inorganic layer 27 is consistent with a pattern of the third flat layer 26, in the patterning process of the second inorganic layer 27, the second inorganic layer 27 may be shielded with the pattern of the third flat layer 26 instead of forming a photoresist layer thereon, which saves the manufacturing cost. Specifically, the first inorganic layer 25 and the second inorganic layer 27 may be made of the inorganic materials such as SiN or SiNO, or other inorganic materials, which is not limited here.

In another implementation, after step S401 and before step S402, the manufacturing method provided by the embodiment of the present disclosure may further include the following.

Referring to FIG. 4, a pattern of a first anti-oxidation conductive layer 28 is formed on the first conductive layer 21. The pattern of the first anti-oxidation conductive layer 28 is consistent with the pattern of the first conductive layer 21. The first anti-oxidation conductive layer 28 may protect the first conductive layer 21 against oxidation. In the actual process, the first anti-oxidation conductive layer 28 may be patterned by adopting the same mask as patterning the first conductive layer 21, which may save one mask and save the manufacturing cost. In addition, the formed pattern of the first anti-oxidation conductive layer 28 may cover the pattern of the first conductive layer 21 by adjusting the process parameters in the patterning process, such as the exposure time.

After step S403, the manufacturing method may further include the following.

Referring to FIG. 4, a pattern of a second anti-oxidation conductive layer 29 is formed on the second conductive layer 24. The pattern of the second anti-oxidation conductive layer 29 is consistent with the pattern of the second conductive layer 24. The second anti-oxidation conductive layer 29 may protect the second conductive layer 24 against oxidation. In the actual process, the second anti-oxidation conductive layer 29 may be patterned by adopting the same mask as patterning the second conductive layer 24, which may save one mask and save the manufacturing cost. In addition, the formed pattern of the second anti-oxidation conductive layer 29 may cover the pattern of the second conductive layer 24 by adjusting the process parameters in the patterning process, such as the exposure time.

Specifically, the first anti-oxidation conductive layer 28 and the second anti-oxidation conductive layer 29 may be made of a metal material that is not prone to being oxidized (such as gold), or a metal alloy (such as CuNi), or other materials, which is not limited here.

In the embodiment of the present disclosure, the pattern of the first flat layer is complementary to the pattern of the first conductive layer, and the first flat layer may be patterned by adopting the same mask as patterning the first conductive layer. However, alignment marks on the drive backplane are unable to be reused, resulting in an alignment failure in the patterning process of the first flat layer. Specifically, in the patterning process of the first conductive layer, the photoresist layer is shielded by adopting the mask and exposed by an exposure machine, and the exposure machine captures the alignment marks on the drive backplane to align with corresponding alignment marks on the mask. The alignment marks on the drive backplane and the alignment marks on the mask both have fixed patterns, for example, the shape of the alignment marks on the drive backplane is "#", and the alignment marks in the mask are diamond. However, in the patterning process of the first conductive layer, a pattern consistent with the pattern of the alignment marks in the mask will be formed on the alignment marks on the drive backplane, for example, the diamond pattern is formed on the surface with a shape "#" of the drive backplane, that is, the alignment marks on the drive backplane are shielded. In the subsequent process of patterning the first flat layer, because the alignment marks on the drive backplane are shielded by other patterns, the exposure machine fails to capture the alignment marks on the drive backplane, so as to report an error due to the alignment failure.

Therefore, in order to solve the problem that the alignment marks on the drive backplane are unable to be reused, resulting in the alignment failure in the patterning process of the first flat layer, in the manufacturing method provided by the embodiment of the present disclosure, in step S401, forming the electroplating seed layer on the base substrate may include the following.

Figure 8:
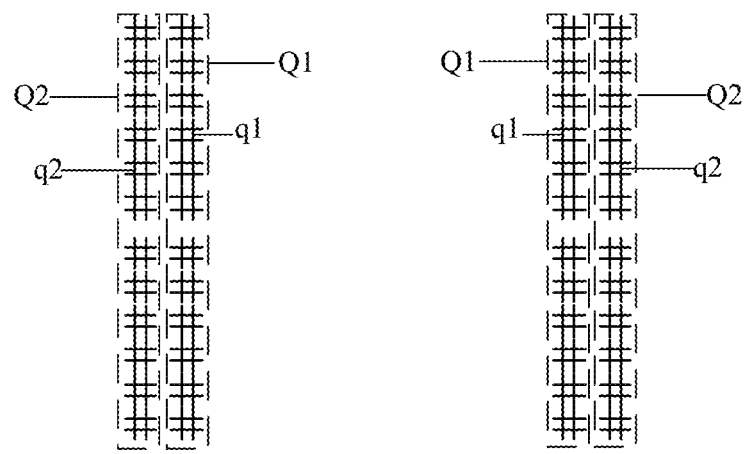
FIG. 8 is a pattern of an electroplating seed layer after patterning according to an embodiment of the present disclosure.

The electroplating seed layer is formed on the base substrate, and is patterned. FIG. 8 is a pattern of the electroplating seed layer after the patterning. As shown in FIG. 8, the patterned electroplating seed layer 31 includes: a plurality of first alignment marks q1, and a plurality of second alignment marks q2. In order to facilitate alignment, the first alignment marks q1 are located in a first alignment region Q1, and the second alignment marks q2 are located in a second alignment region Q2. It should be noted that, in order to illustrate the first alignment marks and the second alignment marks more clearly in FIG. 8, other patterns of the electroplating seed layer are omitted, and in practical applications, the electroplating seed layer may also have other patterns.

In step S401, patterning the photoresist layer includes the following.

Figure 9:
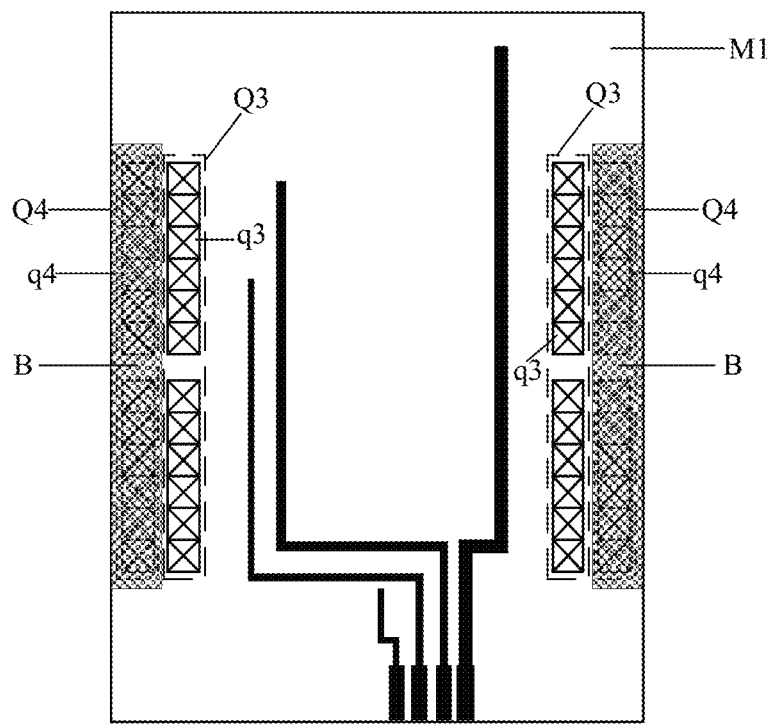
FIG. 9 is a schematic structural diagram of a mask according to an embodiment of the present disclosure.

The mask is provided. FIG. 9 is a schematic structural diagram of the mask. Referring to FIGS. 8 and 9 at the same time, the mask M1 includes: a plurality of third alignment marks q3 respectively corresponding to all the first alignment marks q1, and a plurality of fourth alignment marks q4 respectively corresponding to all the second alignment marks q2. In order to facilitate alignment, the third alignment marks q3 are located in a third alignment region Q3, the fourth alignment marks q4 are located in a fourth alignment region Q4, the third alignment region Q3 corresponds to the first alignment region Q1 in positions, and the fourth alignment region Q4 corresponds to the second alignment region Q2 in positions. It should be noted that FIG. 9 corresponds to the schematic planar structural diagram of the drive backplane as shown in FIG. 3, and the pattern of the mask is not limited. In practical applications, the pattern of the mask may be set based on the specific structure of the drive backplane.

Continuing to refer to FIG. 8 and FIG. 9, the photoresist layer is shielded by adopting the mask M1, and then the photoresist layer is exposed. In the exposing process of the photoresist layer, the fourth alignment marks q4 in the mask M1 are shielded by adopting a baffle B, that is, the fourth alignment region Q4 is shielded by adopting the baffle B, and the third alignment marks q3 in the mask M1 are aligned with the first alignment marks q1 in the electroplating seed layer 31.

Figure 10:
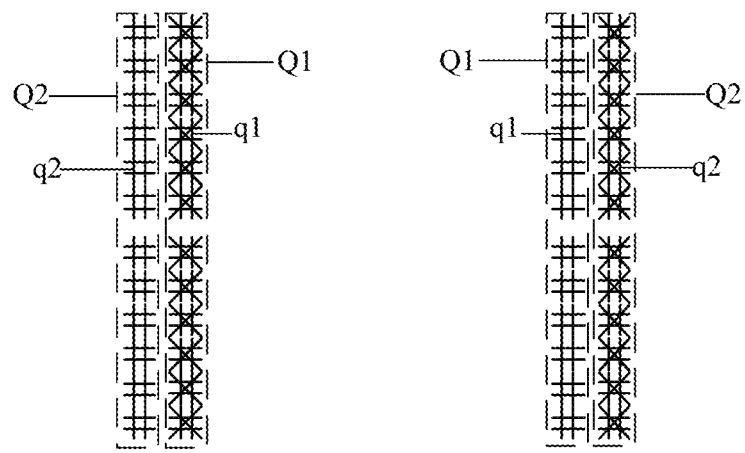
FIG. 10 is a pattern of an electroplating seed layer after a first conductive layer is patterned according to an embodiment of the present disclosure.

FIG. 10 is the pattern of the electroplating seed layer after the first conductive layer is patterned. As shown in FIG. 10, the first alignment marks q1 in the first alignment region Q1 are shielded. Since the fourth alignment marks in the mask are shielded by adopting the baffle in the exposing process of the photoresist layer, no other pattern is formed on the second alignment marks q2 in the electroplating seed layer 31, that is, the second alignment marks q2 are not shielded.

In step S402, patterning the first flat layer by adopting the same mask as patterning the photoresist layer includes the following.

Figure 11:
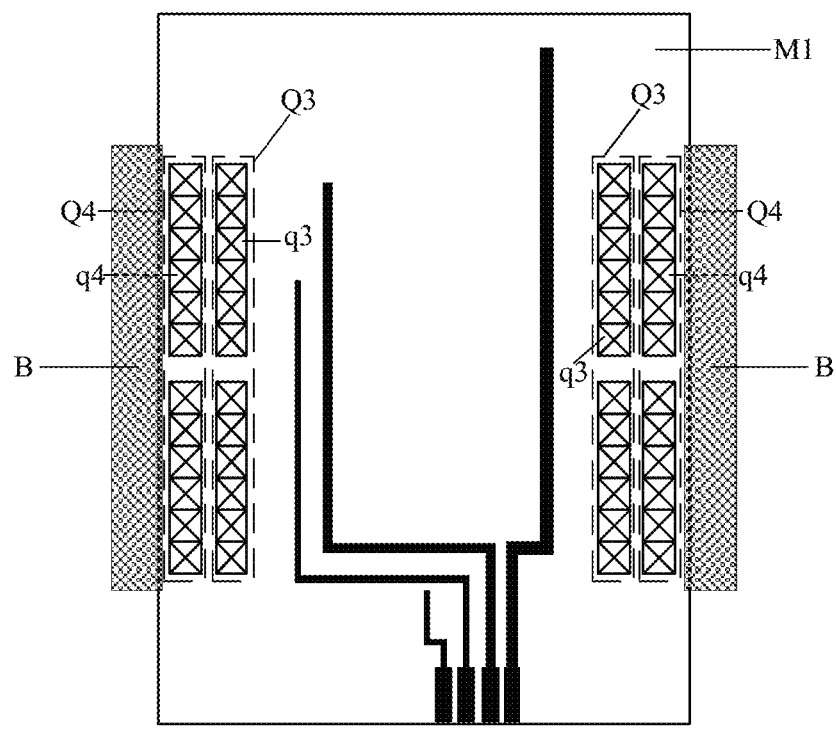
FIG. 11 is a schematic diagram of a mask used in a patterning process of a first flat layer according to an embodiment of the present disclosure.

FIG. 11 is a schematic diagram of the mask used in the patterning process of the first flat layer. Referring to FIGS. 10 and 11 at the same time, the first flat layer is shielded by adopting the mask M1, and then the first flat layer is exposed. In the exposing process of the first flat layer, the baffle B is moved to expose all the fourth alignment marks q4 in the mask M1, and the fourth alignment marks q4 in the mask M1 are aligned with the second alignment marks q2 in the electroplating seed layer 31.

In the embodiment of the present disclosure, the mask and the drive backplane each have two sets of alignment marks; that is, the first alignment marks and the second alignment marks are set in the drive backplane; and the third alignment marks corresponding to the first alignment marks and the fourth alignment marks corresponding to the second alignment marks are set in the mask. Furthermore, in the patterning process of the first conductive layer, the fourth alignment marks in the mask are shielded, so that no other pattern can be formed on the second alignment marks on the drive backplane, therefore in the subsequent patterning process of the first flat layer, the fourth alignment masks in the mark may be aligned with the second alignment marks on the drive backplane. Therefore, accurate alignments can be achieved in the patterning processes twice of the first conductive layer and the first flat layer by adopting the same mask.

It should be noted that FIG. 8 and FIG. 10 are illustrated by setting one first alignment region Q1 and one second alignment region Q2 on two sides of the electroplating seed layer 31 respectively, and in specific implementation, the position and number of the first alignment regions Q1 and the position and number of the second alignment regions Q2 may be set according to the actual situation, which is not limited here. In FIGS. 9 and 11, the baffle B is shown as a semi-transparent pattern in order to clearly illustrate the position of the baffle B. In specific implementation, the baffle B may shield rays of light of the exposure machine, for example, the baffle B may be various objects that may block light, such as a black curtain, a black tape, and an opaque plastic plate.

In the drive backplane, the manufacturing method thereof and the display panel provided by the embodiments of the present disclosure, by forming the pattern of the first flat layer in the region other than the pattern of the first conductive layer, the formed first flat layer has good thickness uniformity. Moreover, the segment gap between the first conductive layer and the first flat layer is small, so that the formed second flat layer may have good thickness uniformity. Therefore, the flat layers (namely, the first flat layer and the second flat layer) between the first conductive layer and the second conductive layer have the good thickness uniformities. Due to the good thickness uniformity of the second flat layer, the difference between the actual size of the formed first via holes and the design value is small, and the overlapping effect between the first conductive layer and the second conductive layer is ensured. In addition, since the pattern of the first flat layer is complementary to the pattern of the first conductive layer, the first flat layer can be patterned by using the same mask as patterning the first conductive layer, thereby saving one mask and saving the manufacturing cost.

It will be apparent to those skilled in the art that various modifications and variations can be made in the present disclosure without departing from the spirit or scope of the present disclosure. Thus, it is intended that the present disclosure cover the modifications and variations of the present disclosure provided they come within the scope of the appended claims and their equivalents.

What is claimed is:

1. A drive backplane, comprising:
   a base substrate;
   a first conductive layer, arranged on the base substrate;
   a first flat layer, arranged in a region, other than a pattern of the first conductive layer, on the base substrate;
   a second flat layer, arranged on a side, facing away from the base substrate, of the first conductive layer and the first flat layer; wherein the second flat layer comprises a plurality of first via holes; and
   a second conductive layer, arranged on a side, facing away from the base substrate, of the second flat layer; wherein a pattern of the second conductive layer is electrically connected with the pattern of the first conductive layer through the plurality of first via holes;
   wherein the drive backplane further comprises:
   a first inorganic layer arranged between the first conductive layer and the first flat layer;
   a third flat layer arranged on a side, facing away from the base substrate, of the second conductive layer; and
   a second inorganic layer arranged between the second conductive layer and the third flat layer; wherein the first inorganic layer comprises: a plurality of second via holes respectively corresponding to the plurality of first via holes; the third flat layer comprises: a plurality of third via holes; and the second inorganic layer comprises: a plurality of fourth via holes respectively corresponding to the plurality of third via holes;
   or,
   wherein the drive backplane further comprises:
   a first anti-oxidation conductive layer arranged between the first conductive layer and the second conductive layer; and
   a second anti-oxidation conductive layer arranged on a side, facing away from the base substrate, of the second conductive layer; wherein a pattern of the first anti-oxidation conductive layer is consistent with the pattern of the first conductive layer; and a pattern of the second anti-oxidation conductive layer is consistent with the pattern of the second conductive layer.

2. The drive backplane according to claim 1, wherein a thickness of the first flat layer is less than or equal to a thickness of the first conductive layer.

3. A display panel, comprising: the drive backplane according to claim 1, and a plurality of light emitting diodes fixed on the drive backplane.

4. A manufacturing method of the drive backplane according to claim 1, comprising:
   forming the pattern of the first conductive layer on the base substrate;
   forming a pattern of the first flat layer in the region other than the pattern of the first conductive layer;
   forming the second flat layer on the first conductive layer and the first flat layer, and patterning the second flat layer to obtain the plurality of first via holes; and
   forming the pattern of the second conductive layer on the second flat layer, wherein the pattern of the second conductive layer is electrically connected with the pattern of the first conductive layer through the plurality of first via holes.

5. The manufacturing method according to claim 4, wherein the forming the pattern of the first conductive layer on the base substrate comprises:
   forming an electroplating seed layer on the base substrate;
   forming a photoresist layer on the electroplating seed layer, and patterning the photoresist layer to obtain a pattern of the photoresist layer complementary to the pattern of the first conductive layer to be formed; and forming the pattern of the first conductive layer by adopting an electroplating process with the pattern of the photoresist layer as a shield;

wherein the forming the pattern of the first flat layer in the region other than the pattern of the first conductive layer comprises:

forming the first flat layer on the first conductive layer by adopting a photoresist material with a same photosensitivity as the photoresist layer; and patterning the first flat layer by adopting a same mask as patterning the photoresist layer.

6. The manufacturing method according to claim 4, wherein the forming the pattern of the first conductive layer on the base substrate comprises:

forming an electroplating seed layer on the base substrate;

forming a photoresist layer on the electroplating seed layer, and patterning the photoresist layer to obtain a pattern of the photoresist layer consistent with the pattern of the first conductive layer to be formed;

patterning the electroplating seed layer to obtain a pattern of the electroplating seed layer; and forming the first conductive layer on the base substrate by adopting an electroplating process;

wherein the forming the pattern of the first flat layer in the region other than the pattern of the first conductive layer comprises:

forming the first flat layer on the first conductive layer by adopting a photoresist material opposite to a photosensitivity of the photoresist layer; and patterning the first flat layer with a same mask as patterning the photoresist layer.

7. The manufacturing method according to claim 4, wherein after forming the pattern of the first conductive layer on the base substrate, and before forming the pattern of the first flat layer in the region other than the pattern of the first conductive layer, the method further comprises:

forming the first inorganic layer on the first conductive layer;

wherein after patterning the second flat layer and before forming the pattern of the second conductive layer on the second flat layer, the method further comprises:

patterning the first inorganic layer with a pattern of the second flat layer as a shield to obtain the plurality of second via holes respectively corresponding to the plurality of first via holes.

8. The manufacturing method according to claim 7, wherein after forming the pattern of the second conductive layer on the second flat layer, the method further comprises:

forming the second inorganic layer on the second conductive layer;

forming the third flat layer on the second inorganic layer, and patterning the third flat layer to obtain the plurality of third via holes; and patterning the second inorganic layer with the third flat layer as a shield to obtain the plurality of fourth via holes respectively corresponding to the plurality of third via holes.

9. The manufacturing method according to claim 4, wherein after forming the pattern of the first conductive layer on the base substrate, and before forming the pattern of the first flat layer in the region other than the pattern of the first conductive layer, the method further comprises:

forming a pattern of the first anti-oxidation conductive layer on the first conductive layer, wherein the pattern of the first anti-oxidation conductive layer is consistent with the pattern of the first conductive layer;

wherein after forming the pattern of the second conductive layer on the second flat layer, the method further comprises:

forming a pattern of the second anti-oxidation conductive layer on the second conductive layer, wherein the pattern of the second anti-oxidation conductive layer is consistent with the pattern of the second conductive layer.

10. The manufacturing method according to claim 5, wherein the forming the electroplating seed layer on the base substrate comprises:

forming the electroplating seed layer on the base substrate, and patterning the electroplating seed layer, wherein the patterned electroplating seed layer comprises: a plurality of first alignment marks and a plurality of second alignment marks;

wherein the patterning the photoresist layer comprises:

providing a mask, wherein the mask comprises: a plurality of third alignment marks respectively corresponding to the plurality of first alignment marks and a plurality of fourth alignment marks respectively corresponding to the plurality of second alignment marks;

shielding the photoresist layer by adopting the mask; and exposing the photoresist layer; wherein in an exposing process of the photoresist layer, the plurality of fourth alignment marks in the mask is shielded by adopting a baffle, and the third alignment marks in the mask are aligned with the first alignment marks in the electroplating seed layer;

wherein the patterning the first flat layer by adopting the same mask as patterning the photoresist layer comprises:

shielding the first flat layer by adopting the mask, and exposing the first flat layer; wherein in an exposing process of the first flat layer, the baffle is moved to expose the fourth alignment marks in the mask, and the fourth alignment marks in the mask are aligned with the second alignment marks in the electroplating seed layer.

11. The manufacturing method according to claim 6, wherein the forming the electroplating seed layer on the base substrate comprises:

forming the electroplating seed layer on the base substrate, and patterning the electroplating seed layer, wherein the patterned electroplating seed layer comprises: a plurality of first alignment marks and a plurality of second alignment marks;

wherein the patterning the photoresist layer comprises:

providing a mask, wherein the mask comprises: a plurality of third alignment marks respectively corresponding to the plurality of first alignment marks and a plurality of fourth alignment marks respectively corresponding to the plurality of second alignment marks; and shielding the photoresist layer by adopting the mask, and exposing the photoresist layer; wherein in an exposing process of the photoresist layer, the plurality of fourth alignment marks in the mask is shielded by adopting a baffle, and the third alignment marks in the mask are aligned with the first alignment marks in the electroplating seed layer;

wherein the patterning the first flat layer by adopting the same mask as patterning the photoresist layer comprises:

shielding the first flat layer by adopting the mask, and exposing the first flat layer; wherein in an exposing process of the first flat layer, the baffle is moved to expose the fourth alignment marks in the mask, and the fourth alignment marks in the mask are aligned with the second alignment marks in the electroplating seed layer.

* * * * *